United States Patent
Liu et al.

(10) Patent No.: US 10,575,401 B1
(45) Date of Patent: Feb. 25, 2020

(54) DIELECTRIC COMPOSITE AND USES THEREOF

(71) Applicant: TAIWAN UNION TECHNOLOGY CORPORATION, Chupei (TW)

(72) Inventors: Shur-Fen Liu, Chupei (TW); Chin-Hsien Hung, Chupei (TW); Wei-Jung Yang, Chupei (TW); Chang-Chih Liu, Chupei (TW)

(73) Assignee: TAIWAN UNION TECHNOLOGY CORPORATION, Chupei (TW)

( * ) Notice: Subject to any disclaimer, the term of this patent is extended or adjusted under 35 U.S.C. 154(b) by 0 days.

(21) Appl. No.: 16/145,822

(22) Filed: Sep. 28, 2018

(30) Foreign Application Priority Data

Aug. 10, 2018 (TW) .............................. 107128026 A

(51) Int. Cl.
| | | |
|---|---|---|
| *H05K 1/03* | (2006.01) | |
| *C08L 9/00* | (2006.01) | |
| *C08K 5/3492* | (2006.01) | |
| *C08F 236/06* | (2006.01) | |
| *C08F 236/08* | (2006.01) | |
| *C08F 4/34* | (2006.01) | |

(52) U.S. Cl.
CPC ............. *H05K 1/0373* (2013.01); *C08F 4/34* (2013.01); *C08F 236/06* (2013.01); *C08F 236/08* (2013.01); *C08K 5/34924* (2013.01); *C08L 9/00* (2013.01); *C08L 2312/00* (2013.01); *H05K 2201/012* (2013.01); *H05K 2201/015* (2013.01); *H05K 2201/0183* (2013.01); *H05K 2201/0209* (2013.01); *H05K 2201/068* (2013.01)

(58) Field of Classification Search
CPC ....... H05K 1/0373; C08F 4/34; C08F 236/06; C08F 236/08; C08K 5/34924; C08L 9/00

USPC ................................................. 174/258, 250
See application file for complete search history.

(56) References Cited

U.S. PATENT DOCUMENTS

| | | |
|---|---|---|
| 5,358,775 A | 10/1994 | Horn, III |
| 5,552,210 A | 9/1996 | Horn, III et al. |
| 2006/0072282 A1 | 4/2006 | Uchida et al. |
| 2017/0033050 A1* | 2/2017 | Kawase ............... H01L 21/563 |

FOREIGN PATENT DOCUMENTS

| | | |
|---|---|---|
| CN | 105086359 A | 11/2015 |
| JP | 54124299 | * 9/1979 |
| JP | H09-293629 A | 11/1997 |
| TW | 201718756 A | 6/2017 |
| TW | 201821547 A | 6/2018 |
| TW | 201823961 A | 7/2018 |

OTHER PUBLICATIONS

Taiwanese Office Action from corresponding Taiwanese Patent Application No. 107128026, dated Sep. 6, 2019.

* cited by examiner

*Primary Examiner* — Timothy J Thompson
*Assistant Examiner* — Charles Pizzuto
(74) *Attorney, Agent, or Firm* — Greer, Burns & Crain, Ltd.

(57) ABSTRACT

A dielectric composite is provided. The dielectric composite includes:
at least one first dielectric layer; and
at least one second dielectric layer,
wherein the first dielectric layer has a thermal coefficient of dielectric constant (TCDk) not higher than −150 ppm/° C., and the second dielectric layer has a TCDK not lower than 50 ppm/° C.; and
the dielectric composite has a dielectric constant (Dk) not lower than 4, and a TCDk ranging from 0 to −150 ppm/° C.

18 Claims, 1 Drawing Sheet

DIELECTRIC COMPOSITE AND USES THEREOF

CLAIM FOR PRIORITY

This application claims the benefit of Taiwan Patent Application No. 107128026 filed on Aug. 10, 2018, the subject matters of which are incorporated herein in their entirety by reference.

BACKGROUND

Field of the Invention

The present invention provides a dielectric composite, especially a dielectric composite with high dielectric constant (Dk) and low thermal coefficient of dielectric constant (TCDk). The dielectric composite has good adhesiveness to a metal foil. The dielectric composite of the present invention can be used in the preparation of laminates and printed circuit boards.

Descriptions of the Related Art

Printed circuit boards are substrates of electronic devices for carrying multiple electronic members that are electrically connected with each other to provide a stable circuit working environment. A printed circuit board is basically manufactured from a laminate which is formed of alternating laminated conductive layers and dielectric layers. Generally, the printed circuit board can be prepared by the following method.

First, a reinforcing material (e.g., a glass-fiber fabrics) is impregnated into a resin (e.g., a polyphenylene ether resin) or a resin is coated onto a reinforcing material. The resin-impregnated or resin-coated reinforcing material is cured to a semi-cured state (known as B-stage) to obtain a prepreg. Afterwards, a predetermined number of prepregs are superimposed to provide a dielectric layer. A conductive layer (e.g., a metal foil) is superimposed on at least one external surface of the dielectric layer to provide a superimposed object. Then, the superimposed object is subjected to a hot-pressing operation (known as C-stage) to obtain a laminate. The conductive layer of the laminate is etched to form a predetermined circuit pattern. Finally, the etched laminate is subjected to a drilling process to form a plurality of holes thereon, and a conductive material is plated on such holes to form via holes, thereby, obtaining the printed circuit board.

Due to the miniaturization of electronic devices, the printed circuit board is required to be thinner and denser and meet high-frequency and high-speed transmission requirements. In addition, as a result of increasing complexity of wireless applications, the circuit design in the field of high-frequency transmission becomes complicated. Examples of the high-frequency transmission include but are not limited to radio frequency (RF) transmission and microwave frequency transmission, which are used to transmit sound, video and data, wherein RF and microwave frequency are between 300 KHz and 300 GHz. With respect to antennas, they have to meet miniaturization, structural simplification, and multiple broadband requirements. To miniaturize antennas, a high-Dk substrate is useful because it could shorten the wavelength of microwave radiation and thus decrease the dimension of antennas. Furthermore, a wiring board (i.e., a printed circuit board) suitable for millimeter wave (also called as "extremely high frequency (EHF)") can be used in antennas, wherein a millimeter wave frequency is between 30 GHz and 300 GHz. Generally, a printed circuit board suitable for millimeter wave should not only have high Dk but also have good dimensional stability and electrical characteristics even under high temperature conditions. To realize a stable signal transmission under high temperature conditions, the printed circuit board must have low TCDk.

U.S. Pat. No. 5,358,775 discloses a high dielectric (Dk≥4) and low TCDk (TCDk≤−150 ppm/° C.) electrical substrate material, which comprises a fluoropolymer filled with particulate ceramic material (powder) which exhibits low loss, comparatively high Dk and acceptable TCDk. Examples of the ceramic powder include "class 1" capacitor ceramics, such as the ceramics named as "NP0". However, such ceramics are quite expensive and therefore unfavorable for mass production.

U.S. Pat. No. 5,552,210 discloses an electrical substrate composite material which is filled with ceramic powder. The electrical substrate composite material comprises a polymeric matrix and at least two particulate ceramic fillers, wherein the polymeric matrix can be a thermoplastic material or a thermoset material, and the at least two particulate ceramic fillers include a filler which has high Dk and low TCDk (TCDk<−300 ppm/° C.) and can be selected from titanium dioxide, strontium titanate and calcium titanate, and a filler which has low Dk and high TCDk (TCDk>0 ppm/° C.) and can be selected from alumina, silica, magnesium oxide and magnesium titanate. In U.S. Pat. No. 5,552,210, the electrical substrate composite material requires a large amount of fillers with a positive TCDk to make the Dk value of the electrical substrate composite material low. Including a large amount of fillers in the composite material makes the viscosity of the varnish for preparing the composite material too high to be processed, and thus lowers the production efficacy. Furthermore, the composite material thus prepared is unfavorable for hot-pressing process due to poor fluidity, and excess fillers could be separated from the polymeric matrix easily, thereby generating defects such as voids and bad appearance in the laminate prepared by using the composite material. In addition, the adhesion between the dielectric layer prepared by the composite material and a metal foil is unsatisfactory.

In view of the above, there is still a need for an electronic substrate material which has desired dielectric properties, excellent thermal resistance, and good processability.

SUMMARY

In view of the aforementioned technical problems, the present invention provides a dielectric composite, which has high Dk, low TCDk, and excellent adhesiveness, such that the electronic material prepared by the dielectric composite is particularly suitable for high-frequency transmission. As illustrated in the following objectives, the technical means of the present invention is to combine at least two dielectric layers with different TCDk values to form a dielectric composite. The electronic material prepared by using the dielectric composite of the present invention has the advantages described above, especially excellent thermal resistance and adhesiveness.

An objective of the present invention is to provide a dielectric composite, which comprises:
at least one first dielectric layer; and
at least one second dielectric layer, wherein the first dielectric layer has a thermal coefficient of dielectric constant (TCDk) not higher than −150 ppm/° C., and the second dielectric layer has a TCDK not lower than 50 ppm/° C.; and the dielectric composite has a dielectric constant (Dk) not lower than 4 and a TCDk ranging from 0 to −150 ppm/° C.

In some embodiments of the present invention, the first dielectric layer has a TCDk not higher than −200 ppm/° C., the second dielectric layer has a TCDK not lower than 100 ppm/° C., and the dielectric composite has a TCDK ranging from −55 to −105 ppm/° C.

In some embodiments of the present invention, the first dielectric layer and the second dielectric layer are prepared by a first dielectric composition and a second dielectric composition, respectively, and the first dielectric composition and the second dielectric composition independently comprise a thermal-curable resin and an inorganic filler.

In some embodiments of the present invention, the thermal-curable resin is selected from the group consisting of an epoxy resin, thermal-curable phenol novolac, thermal-curable polyamino-formaldehyde, thermal-curable silicone, thermal-curable polyethylene, thermal-curable polypropylene, thermal-curable polytetrafluoroethylene (PTFE), thermal-curable polyphenylene ether, and combinations thereof.

In some embodiments of the present invention, the inorganic filler is selected from the group consisting of aluminum silicate, silica (including hollow silica), aluminum oxide, magnesium oxide, magnesium titanate, magnesium hydroxide, calcium carbonate, talc, clays, aluminum nitride, boron nitride, aluminum hydroxide, silicon aluminum carbide, silicon carbide, sodium carbonate, titanium dioxide, strontium titanate, calcium titanate, zinc oxide, zirconium oxide, quartzes, diamonds, diamond-like carbon, graphites, calcined kaolin, pryan, micas, hydrotalcite, PTFE powders, glass beads, ceramic whiskers, carbon nanotubes, nanosized inorganic powders, and mixtures thereof.

In some embodiments of the present invention, the first dielectric composition and the second dielectric composition independently further comprise an additive selected from the group consisting of cross-linking agents, elastomers, catalysts, flame retardants, hardening promoters, colorants, viscosity modifiers, thixotropic agents, defoaming agents, leveling agents, coupling agents, mold-release agents, surface treating agents, plasticizers, antibacterial agents, mildew proofing agents, stabilizers, antioxidants, phosphors, and combinations thereof.

In some embodiments of the present invention, the cross-linking agents are selected from the group consisting of triallyl isocyanurate (TAIC), triallyl cyanurate (TAC), maleimides represented by the following formula (III), maleimides represented by the following formula (IV), and combinations thereof,

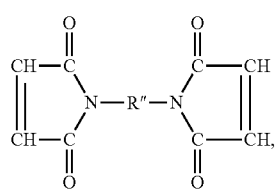

formula (III)

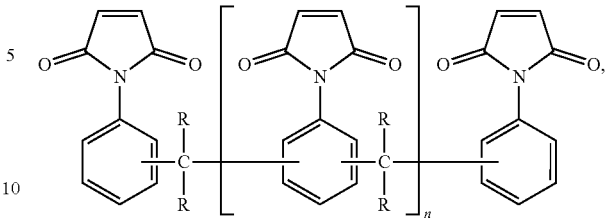

formula (IV)

in formula (III), R″ is a substituted or unsubstituted methylene, 4,4′-diphenylmethane group, m-phenylene, bisphenol A diphenyl ether group, 3,3′-dimethyl-5,5′-diethyl-4,4′-diphenylmethane group, 4-methyl-1,3-phenylene, or (2,2,4-trimethyl) hexamethylene; and in formula (IV), R is H or a $C_1$ to $C_{12}$ alkyl, and n is an integer of 1 to 10.

In some embodiments of the present invention, the elastomers are selected from the group consisting of polybutadiene, polyisoprene, styryl-containing polymers, and combinations thereof.

In some embodiments of the present invention, the catalysts are selected from the group consisting of diisopropyl benzene peroxide, α,α′-bis(tert-butyl peroxy) diisopropyl benzene, benzoyl peroxide, and combinations thereof.

In some embodiments of the present invention, the flame retardants are phosphorus-containing flame retardants, bromine-containing flame retardants, or combinations thereof.

In some embodiments of the present invention, the first dielectric layer is prepared by impregnating or coating a substrate with the first dielectric composition and drying the impregnated or coated substrate, and the second dielectric layer is prepared by impregnating or coating a substrate with the second dielectric composition and drying the impregnated or coated substrate.

In some embodiments of the present invention, the substrate used in the preparation of the first dielectric layer and the substrate used in the preparation of the second dielectric layer are independently selected from the group consisting of glass fiber cloths, glass papers, glass mats, kraft papers, short fiber cotton papers, nature fiber cloths, and organic fiber cloths.

In some embodiments of the present invention, the dielectric composite comprises two or more second dielectric layers, and two of the second dielectric layers are arranged as the two outermost layers of the dielectric composite.

In some embodiments of the present invention, the dielectric composite comprises two or more first dielectric layers, and two of the first dielectric layers are arranged as the two outermost layers of the dielectric composite.

Another objective of the present invention is to provide a laminate, which is prepared by laminating the dielectric composite described above with one or more conductive layers.

In some embodiments of the present invention, the conductive layers are copper foils.

Yet another objective of the present invention is to provide a print circuit board, which is prepared from the laminate described above.

To render the above objectives, the technical features and advantages of the present invention more apparent, the present invention will be described in detail with reference to some embodiments hereinafter.

DETAILED DESCRIPTION

Figure 1:
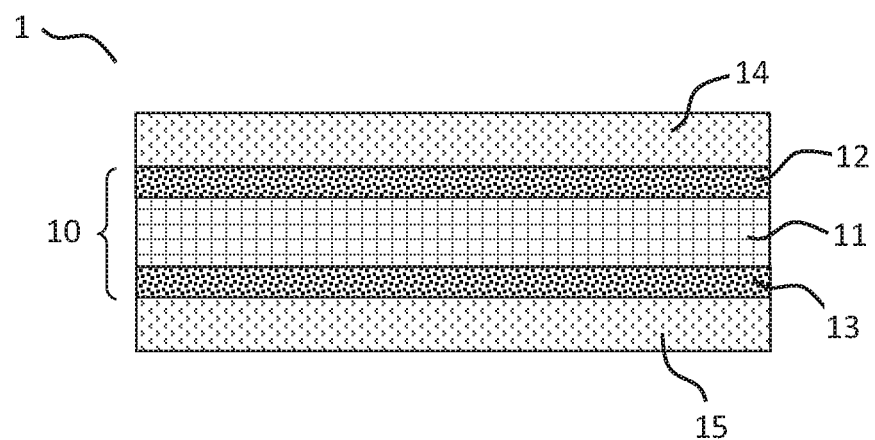
FIG. 1 is a schematic view of an embodiment of the laminate of the present invention.

Hereinafter, some embodiments of the present invention will be described in detail. However, without departing from the spirit of the present invention, the present invention may be embodied in various embodiments and should not be limited to the embodiments described in the specification.

In the appended drawings, similar elements are represented by similar numeral references. For clarity, the thickness of each layer and each area may be exaggerated in the appended drawings and not depicted in actual proportion. When a layer is referred to as being "on" or "over" another layer or substrate, it can be directly on the layer or substrate, or intervening layer(s) may be present.

As used herein, the terms such as "first", "second" or the like are used to distinguish different elements, components, areas, layers, and/or sections, not terms supplying a numerical limit.

Unless it is additionally explained, the expressions "a," "the," or the like recited in the specification (especially in the claims) should include both the singular and the plural forms.

Unless it is additionally explained, while describing the constituents in the solution, mixture and composition in the specification, the amount of each constituent is calculated based on the dry weight, i.e., regardless of the weight of the solvent.

TCDk is a characteristic index for describing how much the Dk will change with changes in temperature, which is defined as a relative average variation rate of Dk for every degree C. increase. The unit of the TCDk is ppm/° C. As used herein, the TCDk is measured according to IPC-TM-650 2.5.5.13 under an operating frequency of 10 GHz.

Compared to the prior art, the features of the present invention lies in that the dielectric composite of the present invention combines at least two dielectric layers with different TCDk values to impart the electronic material prepared by the dielectric composite excellent thermal resistance and adhesiveness and also desired dielectric properties, so that the electronic material can be used in high-frequency transmission. The technical features and efficacy involved in the present invention will be further illustrated below in accordance with several embodiments.

1. Dielectric Composite

1.1. Composition of Dielectric Composite

The dielectric composite of the present invention comprises at least two dielectric layers with different properties, i.e., a first dielectric layer with a TCDk not higher than −150 ppm/° C. and a second dielectric layer with a TCDk not lower than 50 ppm/° C. However, the dielectric composite of the present invention may further comprise dielectric layer(s) other than the first dielectric layer and the second dielectric layer, such as a dielectric layer with a TCDk ranging from −150 ppm/° C. to 50 ppm/° C., as long as the prepared dielectric composite has a Dk not lower than 4 and a TCDk ranging from 0 to −150 ppm/° C. In some embodiments of the present invention, the first dielectric layer has a TCDk not higher than −200 ppm/° C., the second dielectric layer has a TCDK not lower than 100 ppm/° C., and the dielectric composite has a Dk not lower than 7.2 and a TCDK ranging from −55 to −105 ppm/° C.

In the dielectric composite of the present invention, the number of the first dielectric layer or the second dielectric layer is not particularly limited, and the arrangement between the first and second dielectric layers is not particularly limited as well, with the proviso that the dielectric composite has the required Dk and TCDk. For example, the dielectric composite can comprise one to ten layers of first dielectric layer and one to ten layers of second dielectric layer, and the first and second dielectric layers can be arranged alternately or in a manner that at least two of the first dielectric layers or second dielectric layers are next to each other. However, to provide consistent peel strength on each side of the dielectric composite, it is preferred that the two outermost layers of the dielectric composite have the same properties. For example, the two outermost layers of the dielectric composite can be two layers of first dielectric layers or second dielectric layers. In the appended examples, the dielectric composite of the present invention comprises two stacked first dielectric layers as the middle layer of the dielectric composite and two second dielectric layers as the outer layers of the dielectric composite or, alternatively, two stacked second dielectric layers as the middle layer of the dielectric composite and two first dielectric layers as the outer layers of the dielectric composite.

The thickness of the dielectric composite of the present invention is not particularly limited. Generally, the thickness of the dielectric composite can range from 300 μm to 500 μm and more specifically from 350 μm to 450 μm. The thickness of the first dielectric layer can range from 100 μm to 350 μm and more specifically from 120 μm to 320 μm. The thickness of the second dielectric layer can range from 30 μm to 150 μm and more specifically from 45 μm to 120 am. However, the present invention is not limited thereto.

1.2. Preparation of Dielectric Composite

The dielectric composite of the present invention is prepared by superimposing predetermined layers of dielectric layers in any given sequence. Each of the dielectric layers can be prepared by impregnating or coating a substrate with a dielectric composition containing a thermal-curable resin, and drying the impregnated or coated substrate to obtain the dielectric layer or, alternatively, by directly coating a dielectric composition onto a panel (e.g., a glass board, a plastic board, a metal board, and the like) and drying the dielectric composition, and then detaching the dried dielectric composition from the panel. Examples of the substrate include but are not limited to glass fiber cloths (including glass fabrics), glass papers, glass mats, kraft papers, short fiber cotton papers, nature fiber cloths, and organic fiber cloths. In the appended examples, 1035 glass fiber cloth and 2116 glass fiber cloth are used. The coating procedure can be performed by any conventional coating methods, which include but are not limited to roller coating, bar coating, gravure coating, spin coating, slit coating, and die coating. The drying procedure can be performed, for example, for 2 minutes to 5 μminutes under 150° C. to 170° C. In the appended examples, the drying procedure is performed for 3 μminutes under 160° C.

In some embodiments of the present invention, the dielectric composite comprises one or more first dielectric layers and one or more second dielectric layers, and the first dielectric layer and the second dielectric layer are prepared by using a first dielectric composition and a second dielectric composition, respectively. The first dielectric composition and the second dielectric composition independently comprise a thermal-curable resin and an inorganic filler as essential constituents and optional constituents such as additives.

The detailed description for each constituent is provided below. Among which, unless it is particularly stated to the contrary, the description for each constituent applies to the first dielectric composition/first dielectric layer as well as the second dielectric composition/second dielectric layer. When the description for the first dielectric composition/first dielectric layer is identical to the description for the second dielectric composition/second dielectric layer, the term "dielectric composition/dielectric layer" would be used for the ease of description. In addition, also for the ease of description, the thermal-curable resin and optional additives are collectively called as a "resin system", while the resin system does not include inorganic fillers.

1.2.1. Thermal-Curable Resin

As used herein, a thermal-curable resin refers to a resin that can be gradually hardened by forming a network structure through a cross-linking reaction under heating. The thermal-curable resin can be provided by using a single thermal-curable resin or by mixing several thermal-curable resins. Examples of the thermal-curable resin include but are not limited to epoxy resins and the following thermal-curable resins with reactive functional groups: thermal-curable phenol novolac resin, thermal-curable polyamino-formaldehyde, thermal-curable silicone, thermal-curable polyethylene, thermal-curable polypropylene, thermal-curable PTFE, and thermal-curable polyphenylene ether. Among the listed resins, epoxy resins and thermal-curable polyphenylene ether are most commonly used. The reactive functional group here can be any functional group capable of conducting a curing reaction. Examples of the reactive functional group include but are not limited to hydroxyl groups, carboxyl groups, alkenyl groups, and amino groups.

Examples of the thermal-curable polyphenylene ether with reactive functional groups include but are not limited to vinyl-containing polyphenylene ether resins, allyl-containing polyphenylene ether resins, hydroxyl-containing polyphenylene ether resins, and acrylic group-containing polyphenylene ether resins. In particular, the thermal-curable polyphenylene ether with reactive functional groups can be represented by the following formula (I):

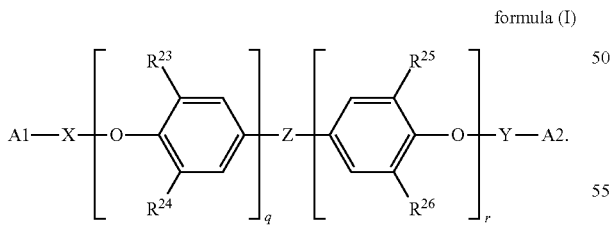

formula (I)

In formula (I),

X and Y are independently

an alkenyl-containing group or absent. It is preferred that X and Y are both absent,

or X is represented by the following formula (I-1) and Y is represented by the following formula (I-2):

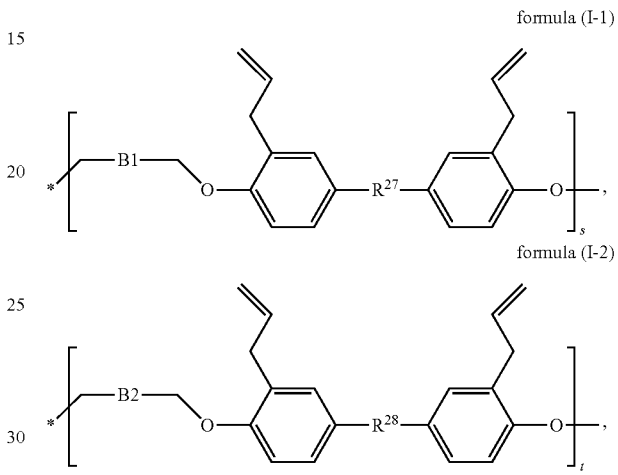

in formulas (I-1) and (I-2), * indicates the end connecting oxygen (—O—) of formula (I);

B1 and B2 are independently

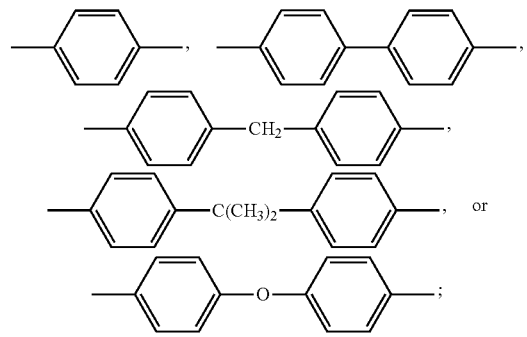

$R^{27}$ and $R^{28}$ are independently —O—, —$SO_2$—, or —$C(CH_3)_2$—, or absent; and s and t are independently an integer, and $1 \leq s+t < 20$, preferably $1 \leq s+t < 10$, and more preferably $1 \leq s+t < 3$.

In formula (I), $R^{23}$ to $R^{26}$ are independently H or a substituted or unsubstituted $C_1$-$C_5$ alkyl, and examples of $C_1$-$C_5$ alkyl includes but are not limited to methyl, ethyl, n-propyl, isopropyl and n-butyl;

q and r are independently an integer ranging from 0 to 100, with the proviso that q and r are not 0 at the same time, and the sum of q and r is preferably $1 \leq (q+r) < 100$, and more preferably $5 \leq (q+r) < 30$;

$A_1$ and $A_2$ are independently selected from the group consisting of

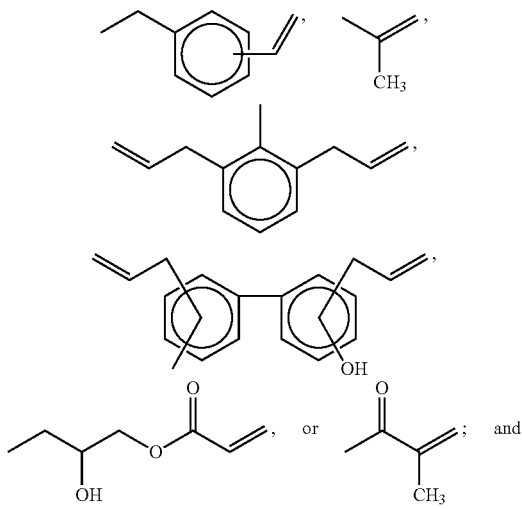

Z is absent, —O—,

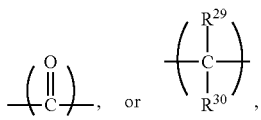

wherein $R^{29}$ and $R^{30}$ are independently H or a $C_1$-$C_{12}$ alkyl.

In some embodiments of the present invention, acrylic group-containing polyphenylene ether resins or vinyl-containing polyphenylene ether resins are used.

As used herein, an epoxy resin refers to a thermal-curable resin with at least two epoxy functional groups in a molecule. The epoxy resin includes but is not limited to a bifunctional epoxy resin, a tetrafunctional epoxy resin, an octofunctional epoxy resin, or a linear phenolic epoxy resin. For example, the epoxy resin can be represented by the following formula (II):

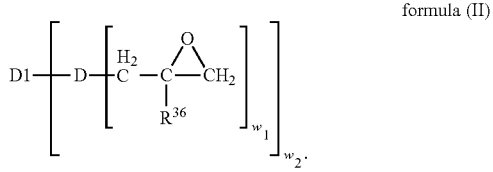

formula (II)

In formula (II), D1 is an organic or inorganic group with a valence of $w_2$, $R^{36}$ is H or a $C_1$ to $C_6$ alkyl, D is oxygen or nitrogen, $w_1$ is 1 or 2 and corresponds to the valence of D, and $w_2$ is an integer between 1 and 100, preferably an integer between 2 and 8 and most preferably an integer between 2 and 4.

Examples of epoxy resins also include the reaction products of epichlorohydrin or epibromohydrin with phenolic compounds. Examples of phenolic compounds include but are not limited to resorcinol, catechol, hydroquinone, 2,6-dihydroxy naphthalene, 2,7-dihydroxy naphthalene, 2-(diphenylphosphoryl)hydroquinone, bis(2,6-dimethylphenol), 2,2'-biphenol, 4,4-biphenol, 2,2',6,6'-tetramethylbiphenol, 2,2',3,3',6,6'-hexamethylbiphenol, 3,3',5,5'-tetrabromo-2,2'6,6'-tetramethylbiphenol, 3,3'-dibromo-2,2',6,6'-tetramethylbiphenol, 2,2',6,6'-tetramethyl-3,3'-dibromobiphenol, 4,4'-isopropylidenediphenol (bisphenol A), 4,4'-isopropylidenebis(2,6-dibromophenol) (tetrabromobisphenol A), 4,4'-isopropylidenebis(2,6-dimethylphenol) (teramethylbisphenol A), 4,4'-isopropylidenebis(2-methylphenol), 4,4'-isopropylidenebis(2-allylphenol), 4,4'-(1,3-phenylenediisopropylidene)bisphenol (bisphenol M), 4,4'-isopropylidenebis(3-phenylphenol), 4,4'-(1,4-phenylenediisoproylidene)bisphenol (bisphenol P), 4,4'-ethylidenediphenol (bisphenol E), 4,4'-oxydiphenol, 4,4'-thiodiphenol, 4,4'-thiobis(2,6-dimethylphenol), 4,4'-sulfonyldiphenol, 4,4'-sulfonylbis(2,6-dimethylphenol), 4,4'-sulfinyldiphenol, 4,4'-(hexafluoroisoproylidene)bisphenol (Bisphenol AF), 4,4'-(1-phenylethylidene)bisphenol (Bisphenol AP), bis(4-hydroxyphenyl)-2,2-dichloroethylene (Bisphenol C), bis(4-hydroxyphenyl)methane (Bisphenol F), bis(2,6-dimethyl-4-hydroxyphenyl)methane, 4,4'-(cyclopentylidene)diphenol, 4,4'-(cyclohexylidene)diphenol (Bisphenol Z), 4,4'-(cyclododecylidene)diphenol, 4,4'-(bicyclo[2.2.1]heptylidene)diphenol, 4,4'-(9H-fluorene-9,9-diyl)diphenol, 3,3-bis(4-hydroxyphenyl)isobenzofuran-1 (3H)-one, 1-(4-hydroxyphenyl)-3,3-dimethyl-2,3-dihydro-1H-inden-5-ol, 1-(4-hydroxy-3,5-dimethylphenyl)-1,3,3,4,6-pentamethyl-2,3-dihydro-1H-inden-5-ol, 3,3,3',3'-tetramethyl-2,2',3,3'-tetrahydro-1,1'-spirobi[indene]-5-,6'-diol (Spirobiindane), dihydroxybenzophenone (bisphenol K), tris(4-hydroxyphenyl)methane, tris(4-hydroxyphenyl)ethane, tris(4-hydroxyphenyl)propane, tris(4-hydroxyphenyl)butane, tris(3-methyl-4-hydroxyphenyl)methane, tris(3,5-dimethyl-4-hydroxyphenyl)methane, tetrakis(4-hydroxyphenyl)ethane, tetrakis(3,5-dimethyl-4-hydroxyphenyl)ethane, bis(4-hydroxyphenyl)phenylphosphine oxide, dicyclopentadienylbis(2,6-dimethyl phenol), dicyclopentadienyl bis(2-methylphenol), and dicyclopentadienyl bisphenol. The listed phenolic compounds can be used either alone or in any combination.

The synthesis method of the epoxy resin is not one of the features of the invention and can be performed by persons having ordinary skill in the art based on their ordinary skill after reading the disclosure of the subject application and therefore, will not be described in detail here. In some embodiments of the present invention, the thermal-curable resin comprises dicyclopentadiene-type epoxy resin, which is obtained by reacting dicyclopentadienyl bisphenol with epichlorohydrin or epibromohydrin.

In the dielectric composition, based on total weight of the resin system, the content of the thermal-curable resin can range from 25 wt % to 75 wt % and more specifically from 30 wt % to 70 wt %, such as 32 wt %, 35 wt %, 38 wt %, 40 wt %, 42 wt %, 43 wt %, 45 wt %, 46 wt %, 48 wt %, 49 wt %, 50 wt %, 52 wt %, 53 wt %, 54 wt %, 55 wt %, 57 wt %, 58 wt %, 59 wt %, 60 wt %, 62 wt %, 65 wt %, or 68 wt %. However, the amount of the thermal-curable resin is not limited to the specified ranges but can be adjusted depending on the need of persons having ordinary skill in the art.

1.2.2. Inorganic Filler

Inorganic filler can targetedly improve the physicochemical properties of the dielectric layer, such as dielectric constant or TCDk. Examples of inorganic filler include but are not limited to the inorganic filler selected from the group consisting of aluminum silicate, silica (including hollow silica), aluminum oxide, magnesium oxide, magnesium titanate, magnesium hydroxide, calcium carbonate, talc, clays, aluminum nitride, boron nitride, aluminum hydroxide, silicon aluminum carbide, silicon carbide, sodium carbonate, titanium dioxide, strontium titanate, calcium titanate, zinc oxide, zirconium oxide, quartzes, diamonds, diamond-like carbon, graphites, calcined kaolin, pryan, micas, hydrotalcite, PTFE powders, glass beads, ceramic whiskers, carbon nanotubes, nanosized inorganic powders, and mixtures thereof.

Persons having ordinary skill in the art can select suitable types of the filler and the amount for the selected filler based on their ordinary skill as well as the disclosure of the subject specification. For example, persons having ordinary skill in the art can adjust the TCDk of the dielectric layers by using an inorganic filler with a negative TCDk, such as titanium dioxide, strontium titanate, and calcium titanate, each of them has a TCDk lower than −300 ppm/° C., or an inorganic filler with a positive TCDk, such as aluminum silicate, silica, aluminum oxide, magnesium oxide, and magnesium titanate. In the appended examples, strontium titanate, titanium dioxide, aluminum oxide, aluminum silicate, and silica are used.

Based on the total weight of the dielectric composite, the content of the inorganic filler can range from 50 wt % to 90 wt % and more specifically from 60 wt % to 85 wt %, such as 62 wt %, 63 wt %, 65 wt %, 66 wt %, 67 wt %, 68 wt %, 70 wt %, 72 wt %, 73 wt %, 75 wt %, 77 wt %, 78 wt %, 80 wt %, 82 wt %, or 84 wt %. However, the amount of the inorganic filler is not limited to the specified range but can be adjusted depending on the need of persons having ordinary skill in the art.

1.2.3. Additives

In addition to the thermal-curable resin and inorganic filler, the dielectric composition can optionally comprise other additives to adaptively improve the processability of the dielectric composition during the manufacturing process or improve the physicochemical properties of the electronic material manufactured by using the dielectric composition. Examples of the additives include but are not limited to cross-linking agents, elastomers, catalysts, flame retardants, hardening promoters, colorants, and defoaming agents as described below and other conventional additives known to the art. Other conventional additives include dispersing agents, viscosity modifiers, thixotropic agents, leveling agents, coupling agents, mold-release agents, surface treating agents, plasticizers, antibacterial agents, mildew proofing agents, stabilizers, antioxidants, and phosphors. The additives can be used either alone or optionally in combination.

[Cross-Linking Agents]

As used herein, cross-linking agents refer to constituents that have reactive functional groups and can react with the thermal-curable resin to carry out a cross-linking curing reaction to form an Interpenetrating Polymer Network (IPN) structure, thereby further improving the physicochemical properties and dielectric characteristics of the prepared electronic material, like increasing the Tg of the electronic material or lowering the water absorption or Df of the electronic material. The "IPN structure" means a network structure formed from two or more polymers where the molecular chains interpenetrate each other and crosslink with chemical bonds.

The cross-linking agents are not particularly limited as long as they have reactive functional groups and can react with the thermal-curable resin. Examples of the cross-linking agents include but are not limited to the cross-linking agents selected from the group consisting of TAIC, TAC, maleimides represented by the following formula (III), maleimides represented by the following formula (IV), and combinations thereof:

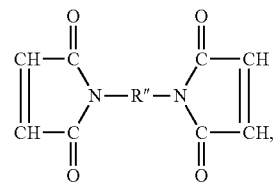

formula (III)

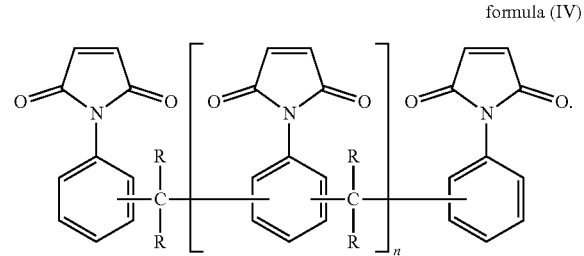

formula (IV)

In formula (III), R″ is a substituted or unsubstituted methylene (—CH$_2$—), 4,4′-diphenylmethane group

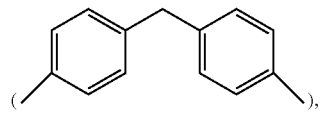

m-phenylene

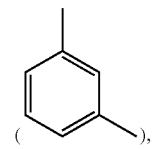

bisphenol A diphenyl ether group

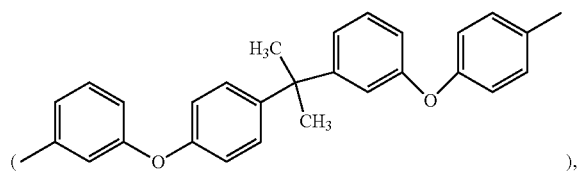

3,3′-dimethyl-5,5′-diethyl-4,4′-diphenylmethane group

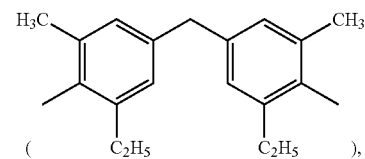

4-methyl-1,3-phenylene

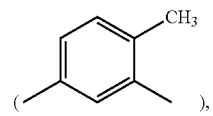

or (2,2,4-trimethyl) hexamethylene

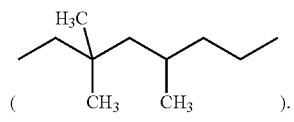

In formula (IV), R is H or a $C_1$ to $C_{12}$ alkyl, and n is an integer of 1 to 10.

The above-mentioned cross-linking agents can be used either alone or in any combination. In the appended examples, TAIC and maleimides represented by formula (IV) (wherein R is H) are used as the cross-linking agents.

[Elastomers]

Generally, elastomers can improve the dielectric characteristics and physicochemical properties of the electronic material prepared by using the dielectric composition. Examples of elastomers include but are not limited to polybutadiene, polyisoprene, and vinyl-containing polymers. The above elastomers can be used either alone or in any combination. Examples of vinyl-containing polymers include but are not limited to butadiene-styrene copolymers and isoprene-styrene copolymers. In the appended examples, butadiene-styrene copolymers are used as elastomers.

[Catalysts]

As used herein, catalysts refer to constituents that can promote a cross-linking reaction. Common catalysts for the cross-linking reaction include but are not limited to organic peroxides. Examples of organic peroxides include but are not limited to dicumyl peroxide (DCP), α,α'-bis(t-butylperoxy)diisopropyl benzene, and benzoyl peroxide (BPO). The catalysts can be used either alone or in any combination. In the appended examples, α,α'-bis(t-butylperoxy)diisopropyl benzene is used as the catalyst.

[Flame Retardants]

Generally, flame retardants can enhance the flame retardance of the electronic material prepared by using the dielectric composition. Examples of flame retardants include but are not limited to phosphorus-containing flame retardants and bromine-containing flame retardants. Examples of phosphorus-containing flame retardants include but are not limited to phosphates, phosphazenes, poly ammonium phosphates, melamine phosphates, melamine cyanurates, and combinations thereof. Examples of phosphazenes include but are not limited to cyclic phosphazene compounds and linear phosphazene compounds. Examples of cyclic phosphazene compounds include but are not limited to hexaphenoxy cyclotriphosphazene. Examples of bromine-containing flame retardants include but are not limited to tetrabromobisphenol A, decabromodiphenyloxide, decabrominated diphenyl ethane, 1,2-bis(tribromophenyl) ethane, brominated epoxy oligomer, octabromotrimethylphenyl indane, bis(2,3-dibromopropyl ether), tris(tribromophenyl) triazine, brominated aliphatic hydrocarbon, and brominated aromatic hydrocarbon. The above flame retardants can be used either alone or in any combination. In the appended examples, hexaphenoxy cyclotriphosphazene is used as a flame retardant.

[Hardening Promoters]

Generally, hardening promoters can promote the hardening of the resin system and lower the hardening reaction temperature of the resin system. Examples of hardening promoters include but are not limited to compounds represented by the following formula (V):

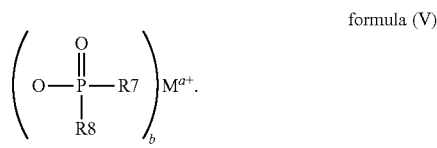

formula (V)

In formula (V), R7 and R8 are independently a C1-C5 alkyl; $M^{a+}$ is a metal ion selected from the group consisting of $Al^{3+}$, $Zn^{2+}$, $Ca^{2+}$, $Ti^{4+}$, $Mg^{2+}$, $Sr^{2+}$, $Ba^{2+}$, $K^+$, and $Cu^{2+}$; and b is an integer of 1 to 4.

In addition, suitable hardening promoters also include but are not limited to tertiary amines, quaternary ammoniums, imidazoles, and pyridines. The listed hardening promoters can be used either alone or in any combination. Examples of imidazoles include but are not limited to 2-methyl imidazole, 2-ethyl-4-methyl imidazole, and 2-phenyl imidazole. Examples of pyridines include but are not limited to 2,3-diamino pyridine, 2,5-diamino pyridine, 2,6-diamino pyridine, 4-dimethylamino pyridine, 2-amino-3-methyl pyridine, 2-amino-4-methyl pyridine, and 2-amino-3-nitro pyridine.

[Colorants]

As used herein, colorants refer to inks with resistance to printing. Examples of colorants include but are not limited to phthalocyanine blue, phthalocyanine green, iodine green, bis-azo yellow, crystal violet, titanium oxide, carbon black, and naphthalene black.

[Defoaming Agents]

Generally, defoaming agents can eliminate foam in the resin system to avoid forming voids in the cured products. Examples of defoaming agents include but are not limited to polysiloxane-based compounds (e.g., polydimethylsiloxane), modified polysiloxane-based compounds, fluorine-containing compounds, polymer-based compounds, and surfactants.

In the dielectric composition, the amount of each additives is not particularly limited and can be adjusted by persons having ordinary skill in the art depending on the need based on their ordinary skill after reading the disclosure of the subject application.

1.2.4. Preparation of Dielectric Composition

The dielectric composition of the present invention can be prepared into varnish form by evenly mixing each constituents of the resin system, including the thermal-curable resin and other optional additives, through a stirrer and dissolving or dispersing the obtained mixture into a solvent. Afterwards, inorganic filler can be further added into the varnish of the dielectric composition, and the viscosity of the varnish can be adjusted for subsequent applications by using the solvent. The solvent can be any inert solvent that can dissolve or disperse but does not react with the constituents of the dielectric composition. Examples of the solvent which can dissolve or disperse the constituents of the dielectric composition include but are not limited to toluene, γ-butyrolactone, methyl ethyl ketone, cyclohexanone, butanone, acetone, xylene, methyl isobutyl ketone, N,N-dimethylformamide (DMF), N,N-dimethylacetamide (DMAc), and N-methyl-pyrolidone (NMP). The listed solvents can be used either alone or in any combination. The amount of solvent is not particularly limited as long as the constituents of the dielectric composition can be evenly dissolved or dispersed therein and the dielectric composition can have suitable viscosity. In the appended examples, methyl ethyl ketone is used as the solvent.

2. Laminate and Printed Circuit Board

The dielectric composite of the present invention can be used as the material of the dielectric layer of a laminate. Therefore, the present invention also provides a laminate. The laminate of the present invention comprises at least one conductive layer and a dielectric composite of the present invention as a dielectric layer. The laminate of the present invention can be prepared by the following method: superimposing a conductive layer on at least one external surface of the dielectric composite to provide a superimposed object, and then the superimposed object is subjected to a hot-pressing operation to obtain a laminate. The hot-pressing operation can be conducted as follows: performing the hot-pressing for 60 to 180 μminutes under a temperature ranging from 180° C. to 220° C. and a pressure ranging from 2 MPa to 5 MPa. In the appended examples, hot-pressing is performed for 120 μminutes under 200° C. and 3 MPa.

Examples of the conductive layer of the laminate according to the present invention include but are not limited to metal foils, metal films, and metal plates. In some embodiments of the present invention, the conductive layer is a metal foil. Examples of the material of the metal foil include but are not limited to copper, aluminum, stainless steel, zinc, iron, nickel, gold, silver, transition metals, and alloys of two or more metals described above. In the appended examples, copper foils are used.

FIG. 1 is a schematic view of an embodiment of the laminate of the present invention. As shown in FIG. 1, the laminate 1 includes conductive layers 14 and 15 and a dielectric composite 10, wherein the dielectric composite 10 is between the conductive layer 14 and the conductive layer 15. The dielectric composite 10 includes a first dielectric layer 11 and second dielectric layers 12 and 13. The conductive layers 14 and 15 can be identical or different, and each of them can be a metal foil such as a copper foil. The first dielectric layer 11 has a TCDk not higher than −150 ppm/° C., the second dielectric layers 12 and 13 each has a TCDk not lower than 50 ppm/° C., and the dielectric composite 10 has a TCDk ranging from 0 to −150 ppm/° C. and a Dk not lower than 4. It is preferred that the first dielectric layer 11 has a TCDk not higher than −200 ppm/° C., the second dielectric layers 12 and 13 each has a TCDk not lower than 100 ppm/° C., and the dielectric composite 10 has a TCDk ranging from −55 to −105 ppm/° C. and a Dk not lower than 7.

The present invention also provides a printed circuit board, which is prepared by patterning the external metal foil of the laminate of the present invention. Applicable methods for patterning include but are not limited to photolithography, screen printing, and ink-jet printing.

Figure 2:
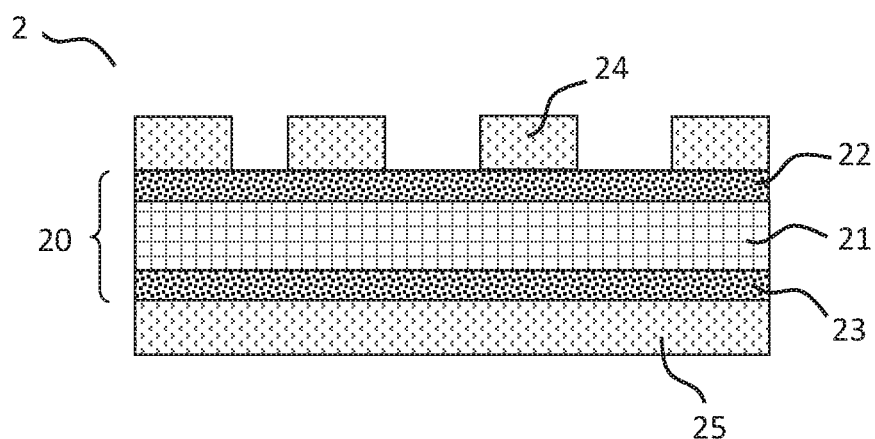
FIG. 2 is a schematic view of an embodiment of the printed circuit board of the present invention.

FIG. 2 is a schematic view of an embodiment of the printed circuit board of the present invention. As shown in FIG. 2, the printed circuit board 2 includes conductive layers 24 and 25 and a dielectric composite 20, wherein the dielectric composite 20 is between the conductive layer 24 and the conductive layer 25, and the conductive layer 24 is patterned. The dielectric composite 20 includes a first dielectric layer 21 and second dielectric layers 22 and 23. The conductive layers 24 and 25 can be identical or different, and each of them can be a metal foil such as a copper foil. The dielectric properties and constitutions of the first dielectric layer 21, second dielectric layers 22 and 23 and dielectric composite 20 are similar to the dielectric properties and constitution of the first dielectric layer 11, second dielectric layers 12 and 13, and dielectric composite 10, and are omitted here.

3. Examples 3.1. Descriptions of Measuring Methods

The present invention will be further illustrated by the embodiments hereinafter, wherein the measuring instruments and methods are respectively as follows:

[Dielectric Constant (Dk) and Dissipation Factor (Df) Measurement]

The dielectric constant (Dk) and dissipation factor (Df) of the laminate are measured and calculated according to IPC TM-650 2.5.5.13 at an operating frequency of 10 GHz.

[Thermal Coefficient of Dielectric Constant (TCDk) Measurement]

The thermal coefficient of dielectric constant (TCDk) of the first dielectric layer, second dielectric layer and dielectric composite is measured and calculated according to IPC TM-650 2.5.5.13 at an operating frequency of 10 GHz. The unit of the TCDk is ppm/° C.

[Peel Strength Test]

The peel strength refers to the bonding strength between the metal foil and laminated dielectric composite, which is expressed by the force required for vertically peel the clad copper foil with a width of ⅛ inch from the surface of the laminated dielectric composite in the peel strength test. The unit of the peel strength is lbf/in.

[Appearance Test]

The copper foils on both sides of the laminate are removed by etching to obtain a superimposed sample whose surfaces are completely removed. The superimposed sample is observed with bare eyes to determine whether the appearance thereof is good. If no gaps, holes or resin separation are found, the appearance of the superimposed sample is determined as good and recorded as "0". If no gaps or holes but resin separation is found, the appearance of the superimposed sample is determined as acceptable and recorded as "A". If gaps or holes are found, the appearance of the superimposed sample is determined as poor and recorded as "x".

3.2. Preparation of Resin System

[Preparation of Resin System A-1]

60 parts by weight of a modified polyphenylene ether resin (trade name: OPE-2St, available from Mitsubishi Gas Chemical), 20 parts by weight of TAIC (trade name: TAIC, available from Nippon Kasei), 10 parts by weight of a maleimide represented by formula (IV) (R is H, trade name: BMI-2300, available from Daiwa Kasei), 10 parts by weight of a butadiene-styrene copolymer (trade name: Ricon 150, available from CRAY VALLEY), 2 parts by weight of α,α'-bis(tert-butyl peroxy) diisopropyl benzene (trade name: PERBUTYL® P, available from NOF CORPORATION) as a catalyst, and 20 parts by weight of hexaphenoxy cyclotriphosphazene (trade name: SPB-100, available from Otsuka Chemical) were mixed under room temperature with a stirrer followed by adding methyl ethyl ketone (available from Fluka) thereinto. After stirring the resultant mixture under room temperature for 60 to 120 μminutes, resin system A-1 was obtained.

[Preparation of Resin System A-2]

55 parts by weight of a modified polyphenylene ether resin (trade name: SA 9000, available from SABIC), 15 parts by weight of BMI-2300, 20 parts by weight of a butadiene-styrene copolymer (trade name: Ricon 181, available from CRAY VALLEY), 10 parts by weight of a dicyclopentadiene-type epoxy resin (trade name: HP-7200H, available from DIC), 2 parts by weight of PERBUTYL® P, 0.2 parts by weight of 2-ethyl-4-methyl imidazole (trade name: 2E4MZ, available from SHIKOKU CHEMICALS), and 20 parts by weight of SPB-100 were mixed under room temperature with a stirrer followed by adding methyl ethyl ketone thereinto. After stirring the resultant mixture under room temperature for 60 to 120 μminutes, resin system A-2 was obtained.

3.3. Preparation of Dielectric Composition

According to the ratio shown in Table 1-1, inorganic filler(s) were added into each of the resin systems under room temperature, and the obtained mixtures were optionally diluted with methyl ethyl ketone to a solid content of 60 wt % to obtain the first dielectric compositions and second dielectric compositions of Examples 1 to 9 and Comparative examples 1 to 3. The used inorganic fillers are shown in Table 1-2.

TABLE 1-1

Composition of the dielectric compositions of the examples and comparative examples

| Parts by weight | | First dielectric compositions | | | | | Second dielectric compositions | | | | |
|---|---|---|---|---|---|---|---|---|---|---|---|
| | | Resin systems | | Inorganic fillers | | | Resin systems | | Inorganic fillers | | |
| | | A-1 | A-2 | B-1 | B-2 | B-3 | A-1 | A-2 | B-3 | B-4 | B-5 |
| Examples | 1 | 23 | | 77 | | | 30 | | 70 | | |
| | 2 | 25 | | 75 | | | 30 | | | 70 | |
| | 3 | 25 | | | 75 | | 30 | | 70 | | |
| | 4 | 28 | | | 72 | | 314 | | 66 | | |
| | 5 | 20 | | 70 | | 10 | | 35 | 65 | | |
| | 6 | | 25 | 75 | | | 30 | | 70 | | |
| | 7 | 28 | | | 72 | | 30 | | | | 70 |
| | 8 | | 28 | | 72 | | 30 | | 70 | | |
| | 9 | 20 | | 70 | | 10 | | 30 | 70 | | |
| Comparative examples | 1 | 23 | | 77 | | | | | | | |
| | 2 | 12 | | 61 | | 27 | | | | | |
| | 3 | 23 | | 77 | | | 80 | | | | 20 |

TABLE 1-2

Data list of the inorganic fillers used in the examples and comparative examples

| Code | Inorganic filler | Description and purchase source |
|---|---|---|
| B-1 | strontium titanate | Average diameter: 2.0 μm, trade name: 218, available from FERRO |
| B-2 | titanium dioxide | Average diameter: 2.0 μm, trade name: HTO2, available from SUPERRITE |
| B-3 | aluminum oxide | Average diameter: 2.0 μm, trade name: CB-P02, available from SHOWA DENKO |
| B-4 | aluminum silicate | Average diameter: 5.0 μm, trade name: SILATHERM 1360-400, available from Quarzwerke Gruppe (Frechen, German) |
| B-5 | Silica | Average diameter: 1.5 μm, trade name: SC-5500SVJ, available from ADMATECHS |

3.4. Preparation of Dielectric Composite

The first dielectric compositions and second dielectric compositions of Examples 1 to 9 and Comparative examples 1 to 3 were used to prepare the dielectric composites of Examples 1 to 9 and Comparative examples 1 to 3, respectively.

First, the first dielectric compositions of Examples 1 to 9 and Comparative examples 1 to 3 were respectively coated onto glass fiber cloths (trade name: 2116, thickness: 94 am, available from NITTO BOSEKI) by means of a roller coating machine. Then, the coated 2116 glass fiber cloths were placed in an oven and heated and dried at 160° C. for 3 minutes to produce the first dielectric layers of Examples 1 to 9 and Comparative examples 1 to 3 in a semi-cured state (B-stage). The resin content (RC) of the first dielectric layers is shown in Table 2-1. The thickness and TCDk of each first dielectric layer were measured according to the aforementioned measuring methods, and the results are tabulated in Table 2-2.

The second dielectric compositions of Examples 1 to 9 and Comparative examples 1 to 3 were then respectively coated onto glass fiber cloths (trade name: 1035, thickness: 28 jam, available from NITTO BOSEKI) by means of a roller coating machine. Then, the coated 1035 glass fiber cloths were placed in an oven and heated and dried at 160° C. for 3 minutes to produce the second dielectric layers of Examples 1 to 9 and Comparative examples 1 to 3 in a semi-cured state (B-stage). The resin content (RC) of the second dielectric layers is shown in Table 2-1. The thickness and TCDk of each second dielectric layers were measured according to the aforementioned measuring methods, and the results are tabulated in Table 2-2.

Then two pieces of the first dielectric layers of Examples 1 to 7, 9 and Comparative examples 1 to 3 were superimposed and two pieces of the second dielectric layers of Examples 1 to 7, 9 and Comparative examples 1 to 3 were respectively superimposed on the two sides of the superimposed first dielectric layers to produce dielectric composites of Examples 1 to 7, 9 and Comparative examples 1 to 3. Similarly, two pieces of the second dielectric layers of Example 8 were superimposed and two pieces of the first dielectric layers of Example 8 were respectively superimposed on the two sides of the superimposed second dielectric layers to produce a dielectric composite of Example 8. The thickness and TCDk of each dielectric composites were measured according to the measuring methods recited above, and the results are tabulated in Table 2-2.

TABLE 2-1

Resin content of dielectric layers

|  | Examples | | | | | | | | | Comparative Examples | | |
|---|---|---|---|---|---|---|---|---|---|---|---|---|
|  | 1 | 2 | 3 | 4 | 5 | 6 | 7 | 8 | 9 | 1 | 2 | 3 |
| RC of first dielectric layer | 70 | 71 | 73 | 63 | 68 | 70 | 64 | 63 | 68 | 70 | 72 | 70 |
| RC of second dielectric layer | 68 | 65 | 66 | 65 | 67 | 65 | 67 | 67 | 68 | 0 | 0 | 68 |

TABLE 2-2

Properties of dielectric composites

| | | TCDk (unit: ppm/° C.) | | | Thickness (unit: μm) | | |
|---|---|---|---|---|---|---|---|
| | | First dielectric layer | Second dielectric layer | Dielectric composite | First dielectric layer | Second dielectric layer | Dielectric composite |
| Examples | 1 | −258 | 180 | −68 | 305 | 54 | 413 |
| | 2 | −259 | 128 | −117 | 307 | 40 | 407 |
| | 3 | −297 | 178 | −103 | 310 | 53 | 416 |
| | 4 | −231 | 175 | −52 | 280 | 54 | 388 |
| | 5 | −213 | 166 | −35 | 285 | 56 | 397 |
| | 6 | −251 | 176 | −63 | 304 | 52 | 408 |
| | 7 | −234 | 58 | −145 | 289 | 51 | 391 |
| | 8 | −231 | 180 | −77 | 140 | 108 | 388 |
| | 9 | −213 | 181 | −10 | 285 | 53 | 391 |
| Comparative examples | 1 | −258 | | −258 | 305 | 0 | 305 |
| | 2 | −125 | | −125 | 317 | 0 | 317 |
| | 3 | −258 | 31 | −179 | 305 | 55 | 415 |

3.5. Preparation of Laminate

The laminates of Examples 1 to 9 and Comparative examples 1 to 3 were prepared by using the dielectric composites of Examples 1 to 9 and Comparative examples 1 to 3. Two sheets of electro-deposited copper foil (0.5 oz., available from TAIWAN COPPER FOIL) were respectively superimposed on the two sides of the dielectric composites of Examples 1 to 9 and Comparative examples 1 to 3 to provide superimposed objects. Afterwards, each of the superimposed objects were subjected to a high temperature hot-pressing operation through multi-stage vacuum pressing in a hot-pressing machine. Herein, the hot-pressing was performed for 120 μminutes at a temperature of 200° C. and a pressure of 3 MPa.

The appearance, peel strength, Dk and Df of the laminates of Examples 1 to 9 and Comparatives 1 to 3 were analyzed and measured according to the measuring methods recited above, and the results are tabulated in Table 3.

TABLE 3

Properties of laminates

| Unit | | Appearance | Peel strength lbf/in | Dk @ 10 GHz | Df @ 10 GHz |
|---|---|---|---|---|---|
| Examples | 1 | ○ | 3.8 | 10.5 | 0.0053 |
| | 2 | ○ | 3.7 | 8.7 | 0.0051 |
| | 3 | ○ | 3.5 | 10.2 | 0.0040 |
| | 4 | ○ | 3.8 | 8.6 | 0.0039 |
| | 5 | ○ | 3.9 | 8.3 | 0.0062 |
| | 6 | ○ | 3.6 | 9.8 | 0.0069 |
| | 7 | ○ | 4.0 | 7.4 | 0.0053 |
| | 8 | Δ | 3.0 | 9.7 | 0.0060 |
| | 9 | ○ | 3.5 | 8.4 | 0.0060 |
| Comparative examples | 1 | ○ | 3.8 | 14.6 | 0.0053 |
| | 2 | x | 1.8 | 9.2 | 0.0048 |
| | 3 | ○ | 4.5 | 7.1 | 0.0056 |

As shown in Table 3, the electronic materials (i.e., the laminates of Examples 1 to 9) manufactured by using the dielectric composites of the present invention are provided with satisfactory peel strength and dielectric properties, and good appearance. In particular, as can be seen from Examples 1, 3, 6, and 8, when the TCDk of the dielectric composite ranges from −55 to −105 ppm/° C., the electronic material prepared thereby has higher Dk and suitable peel strength and therefore is especially suitable for high-frequency transmission. In addition, as can be seen from Example 8, even the arrangement of the first dielectric layer and the second dielectric layer was changed, the electronic material prepared thereby can still have the desired properties.

By contrast, the electronic materials (i.e., the laminates of Comparative examples 1 to 3) manufactured by using dielectric composites that are not according to the present invention do not have satisfactory peel strength, dielectric properties or appearance. Specifically, as can be seen from Comparative example 1, when the dielectric composite only comprises one single dielectric layer and one single inorganic filler, the absolute value of the TCDk of the dielectric composite (|−258| ppm/° C.) is so high that the Dk of the dielectric composite is relatively unstable when the temperature variation is to a great extent. Furthermore, as can be seen from Comparative example 2, when the dielectric composite only comprises one single dielectric layer, although the absolute value of the TCDk of the dielectric composite (|−125| ppm/° C.) can be decreased by using two kinds of inorganic fillers, excess inorganic fillers tend to be separated from the thermal-curable resin, thereby generating gaps or holes, and thus lead to the electronic material with unsatisfactory appearance and unsatisfactory adhesion between the conduct layers and the dielectric layers (i.e., unsatisfactory peel strength). In addition, as can be seen from Comparative example 3, when the TCDk values of the dielectric layers and the dielectric composite falls outside the designated range of the present invention, the Dk value of the electronic material prepared thereby is unsatisfactory, even though the dielectric composite comprises at least two dielectric layers with different TCDk values.

The above examples are used to illustrate the principle and efficacy of the present invention and show the inventive features thereof. People skilled in this field may proceed with a variety of modifications and replacements based on the disclosures and suggestions of the invention as described without departing from the principle and spirit thereof. Therefore, the scope of protection of the present invention is that as defined in the claims as appended.

BRIEF DESCRIPTION OF NUMERAL REFERENCES

1: laminate
2: printed circuit board
10, 20: dielectric composite
11, 21: first dielectric layer
12, 13, 22, 23: second dielectric layer
14, 15, 24, 25: conductive layer

What is claimed is:

1. A dielectric composite, comprising:
   at least one first dielectric layer; and
   at least one second dielectric layer,
   wherein the first dielectric layer has a thermal coefficient of dielectric constant (TCDk) not higher than −150 ppm/° C., and the second dielectric layer has a TCDK not lower than 50 ppm/° C.; and
   the dielectric composite has a dielectric constant (Dk) not lower than 4 and a TCDk ranging from 0 to −150 ppm/° C.

2. The dielectric composite of claim 1, wherein the first dielectric layer has a TCDk not higher than −200 ppm/° C., the second dielectric layer has a TCDK not lower than 100 ppm/° C., and the dielectric composite has a TCDK ranging from −55 to −105 ppm/° C.

3. The dielectric composite of claim 1, wherein the first dielectric layer and the second dielectric layer are prepared by a first dielectric composition and a second dielectric composition, respectively, and the first dielectric composition and the second dielectric composition independently comprise a thermal-curable resin and an inorganic filler.

4. The dielectric composite of claim 3, wherein the thermal-curable resin is selected from the group consisting of an epoxy resin, thermal-curable phenol novolac, thermal-curable polyamino-formaldehyde, thermal-curable silicone, thermal-curable polyethylene, thermal-curable polypropylene, thermal-curable polytetrafluoroethylene (PTFE), thermal-curable polyphenylene ether, and combinations thereof.

5. The dielectric composite of claim 3, wherein the inorganic filler is selected from the group consisting of aluminum silicate, silica, aluminum oxide, magnesium oxide, magnesium titanate, magnesium hydroxide, calcium carbonate, talc, clays, aluminum nitride, boron nitride, aluminum hydroxide, silicon aluminum carbide, silicon carbide, sodium carbonate, titanium dioxide, strontium titanate, calcium titanate, zinc oxide, zirconium oxide, quartzes, diamonds, diamond-like carbon, graphites, calcined kaolin, pryan, micas, hydrotalcite, PTFE powders, glass beads, ceramic whiskers, carbon nanotubes, nanosized inorganic powders, and mixtures thereof.

6. The dielectric composite of claim 3, wherein the first dielectric composition and the second dielectric composition independently further comprise an additive selected from the group consisting of cross-linking agents, elastomers, catalysts, flame retardants, hardening promoters, colorants, viscosity modifiers, thixotropic agents, defoaming agents, leveling agents, coupling agents, mold-release agents, surface treating agents, plasticizers, antibacterial agents, mildew proofing agents, stabilizers, antioxidants, phosphors, and combinations thereof.

7. The dielectric composite of claim 6, wherein the cross-linking agents are selected from the group consisting of triallyl isocyanurate (TAIC), triallyl cyanurate (TAC), maleimides represented by the following formula (III), maleimides represented by the following formula (IV), and combinations thereof,

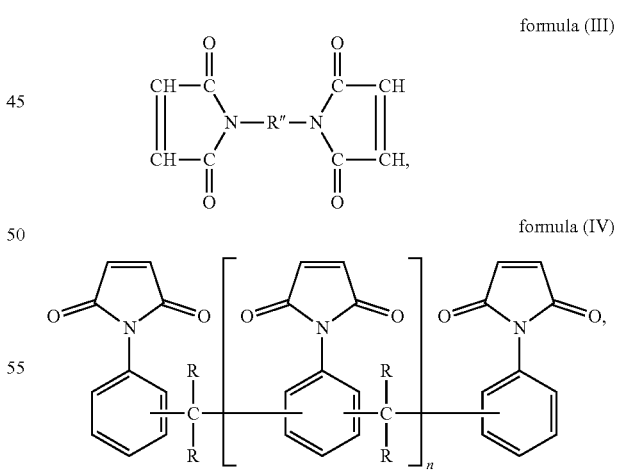

in formula (III), R" is a substituted or unsubstituted methylene, 4,4'-diphenylmethane group, m-phenylene, bisphenol A diphenyl ether group, 3,3'-dimethyl-5,5'-diethyl-4,4'-diphenylmethane group, 4-methyl-1,3-phenylene, or (2,2,4-trimethyl) hexamethylene; and
in formula (IV), R is H or a $C_1$ to $C_{12}$ alkyl, and n is an integer of 1 to 10.

8. The dielectric composite of claim 6, wherein the elastomers are selected from the group consisting of polybutadiene, polyisoprene, styryl-containing polymers, and combinations thereof.

9. The dielectric composite of claim 6, wherein the catalysts are selected from the group consisting of diisopropyl benzene peroxide, $\alpha,\alpha'$-bis(tert-butyl peroxy) diisopropyl benzene, benzoyl peroxide, and combinations thereof.

10. The dielectric composite of claim 6, wherein the flame retardants are phosphorus-containing flame retardants, bromine-containing flame retardants, or combinations thereof.

11. The dielectric composite of claim 3, wherein the first dielectric layer is prepared by impregnating or coating a substrate with the first dielectric composition and drying the impregnated or coated substrate, and the second dielectric layer is prepared by impregnating or coating a substrate with the second dielectric composition and drying the impregnated or coated substrate.

12. The dielectric composite of claim 11, wherein the substrate used in the preparation of the first dielectric layer and the substrate used in the preparation of the second dielectric layer are independently selected from the group consisting of glass fiber cloths, glass papers, glass mats, kraft papers, short fiber cotton papers, nature fiber cloths, and organic fiber cloths.

13. The dielectric composite of claim 1, which comprises two or more second dielectric layers, two of the second dielectric layers are arranged as two outermost layers of the dielectric composite.

14. The dielectric composite of claim 1, which comprises two or more first dielectric layers, two of the first dielectric layers are arranged as outermost layers of the dielectric composite.

15. A laminate, which is prepared by laminating the dielectric composite of claim 1 with one or more conductive layers.

16. The laminate of claim 15, wherein the conductive layers are copper foils.

17. A printed circuit board, which is prepared from the laminate of claim 15.

18. A printed circuit board, which is prepared from the laminate of claim 16.

* * * * *